United States Patent [19]

Kalantery

[11] Patent Number: 5,801,938
[45] Date of Patent: Sep. 1, 1998

[54] DATA PROCESSING METHOD AND APPARATUS FOR PARALLEL DISCRETE EVENT SIMULATION

[75] Inventor: Nasser Kalantery, 100 Roseberry Gardens, London N4 1JL, United Kingdom

[73] Assignee: Nasser Kalantery, London, United Kingdom

[21] Appl. No.: 538,248

[22] Filed: Oct. 3, 1995

[30] Foreign Application Priority Data

Oct. 3, 1994 [GB] United Kingdom .................. 9419892

[51] Int. Cl.⁶ .................. G06F 9/46; G06F 9/44
[52] U.S. Cl. .................. 364/131; 364/230; 395/553; 395/676
[58] Field of Search .................. 364/131, 578, 364/DIG. 1, 229, 230, 242.94, 280, 284.3, 284, DIG. 2; 395/182.13, 200.1, 200.5, 200.6, 354, 182.07, 733, 736, 739, 553–557

[56] References Cited

U.S. PATENT DOCUMENTS

| | | | |
|---|---|---|---|
| 4,636,967 | 1/1987 | Bhatt et al. | 364/550 |
| 4,751,637 | 6/1988 | Catlin | 364/200 |
| 4,866,605 | 9/1989 | Nakano et al. | 364/200 |
| 4,901,260 | 2/1990 | Lubachevsky | 364/578 |
| 4,914,612 | 4/1990 | Beece et al. | 364/578 |
| 4,942,615 | 7/1990 | Hirose | 364/578 |
| 5,375,074 | 12/1994 | Greenberg et al. | 364/578 |
| 5,596,742 | 1/1997 | Agarwal et al. | 395/500 |

FOREIGN PATENT DOCUMENTS

0445954A2  2/1991  European Pat. Off. .
A20445954  9/1991  European Pat. Off. .

OTHER PUBLICATIONS

New Advances in Computer Graphics. Proc. of International "89" published 1989, Springer–Verlag, pp. 507–522, et al. Jevans Daj Optimistic Multi–Processor Ray Tracing.
Tenth Annual Int. Phoenix Conf on Computers and Communications published 1991, IEEE, pp. 183–189, Chung Y et al. Time Warp for Efficient Parallel Logic Simulation, Etc.

*Primary Examiner*—Emanuel T. Voeltz
*Assistant Examiner*—Bryan Bui
*Attorney, Agent, or Firm*—Cesari and McKenna, LLP

[57] ABSTRACT

Data processing apparatus comprises distributed processors for the parallel discrete event simulation of physical processes by the parallel execution of virtual-time-stamped logical processes scheduled by the transmission of virtual-time-stamped messages on logical channels between the processors. Each processor has a clock representing virtual time and ordering forward processing, and a memory for storing a state queue, representative of the physical state at different times of the system upon which the physical processes operate. Each processor is programmed with an operating system supporting optimistic time warp management of the message scheduling and message transmission and of the state queue, allowing interruption of forward processing for local rollback to an earlier virtual time and to earlier states and allowing cancellation of messages upon recognition by the processor of a sequence error in messages received at that or another processor.

14 Claims, 5 Drawing Sheets

DATA PROCESSING METHOD AND APPARATUS FOR PARALLEL DISCRETE EVENT SIMULATION

This invention relates to data processing apparatus for parallel discrete event simulation, sometimes referred to as distributed simulation, i.e. to the execution of a single discrete event simulation program on a parallel computer. In particular, the parallel computer most suited to parallel discrete event simulation is the distributed-memory computer, consisting of separate distributed processors linked by channels for the passage of communications.

By way of background information on parallel computing, distributed-memory parallel programming is described in "Introduction to Parallel Computing" by Ted G. Lewis and Hesham El-Rewini, 1992, Prentice-Hall, Inc. Distributed memory computers are better than shared-memory computers for massive parallelism, but it is still the subject of intensive research to minimize the inherent problems of low machine efficiency due to interprocessor communication, and the difficulty of programming. It is important to minimize the overheads, i.e. the cost in computational speed associated with communications; to maximise load balancing between the processors; and to optimize processor scheduling, ensuring that tasks are not allocated to the wrong processors thereby increasing communication costs and introducing load balancing problems.

Parallel discrete event simulation (PDES) is described in Fujimoto R. M.: "Parallel Discrete Event Simulation", Communications of the ACM, October 1990, Volume 33, No. 10, pages 30–50, referred to in this document as "[FUJ90]". PDES has attracted considerable interest in recent years, because there is a tremendous demand for large simulations in engineering, computer science, economics and military applications. Such simulations consume huge periods of time on conventional sequential machines. Parallel simulation is the obvious solution, but simulation is paradoxically surprisingly difficult to parallelize in practice.

A physical system can be simulated by representing it as a set of state-variables or states, all of which are subject to change as a result of "processes". A subset of the states can be stored at each of a multiplicity of processors, in local memory. Events or tasks are scheduled for execution at each processor, under the control of its local operating system.

The assumption that processors can satisfactorily operate on just a subset of the states representative of the entire physical system underlies PDES. The simulation model changes from one state to another upon the occurrence of an event, and these discrete events are at completely irregular intervals. Typical events include the arrival of a message at an arbitrary node in a network; the forwarding of a message to another node; and the failure of an electronic component in the system. The system is asynchronous, so each local processor has its own clock. It is however essential to ensure that the parallel execution avoids errors of causality as a consequence of dependency. Therefore there has to be some form of global clock or sequencing, which has the effect of time-stamping each logical process in the entire simulation. [FUJ90] describes conservative mechanisms for PDES, which determine when it is safe to process an event without causing any causality error. If a process contains an unprocessed event with a particular time stamp, and no other process with a smaller time stamp, i.e. one relating to an earlier time, and if that process can determine that it is impossible for it subsequently to receive an event, i.e. a message, with a smaller time stamp from anywhere, then that process can safely process the unprocessed event because it is certain that there will be no violation of the local causality constraint. Various algorithms have been proposed for conservative mechanisms, but all are limited by the efficiency of looking ahead to predict the safety of processing events. (In this specification, the term "event" is used interchangeably with "message" since they are essentially equivalent in the context of simulation.) Depending on the efficiency of lookahead, the speedup achievable by parallelisation can be positive or even negative; generally, the conclusion has been that optimistic mechanisms will be superior to conservative mechanisms for PDES.

Optimistic mechanisms are also introduced in [FUJ90]. Optimistic methods detect and recover from causality errors, instead of strictly avoiding them. Consequently, they do not need to look ahead to determine when it is safe to execute messages: instead, they detect when causality errors have occurred, and then invoke a recovery procedure. This more flexible mechanism exploits further the benefits of parallelism, and generally improves on speedup.

Possibly the best known optimistic mechanism is known as "Time Warp". In "Time Warp", a causality error is assumed to have occurred whenever a message (event) received at a processor contains a time stamp smaller than that of the local clock, which would be set at the time stamp of the most recently processed message at that processor. Such a message, received out of sequence, is known as a "straggler". Recovery is then initiated by a procedure known as "rollback", which undoes the effects, throughout the simulation engine, of all the messages that have been processed prematurely as a consequence of the straggler, i.e. all those processed events which have time stamps larger than that of the straggler. Rollback may well have to spread over several processors, using messages. This is because states may have changed as a result of premature processing at several processors, and rolling back has to undo those changes of state both at the straggler-receiving processor and at other destination processors. An essential part of Time Warp therefore is the storing of the state-variables in a sequence in memory, so as to be able to revert to previous states in rollback.

The classic "Time Warp" mechanism is disclosed for example in Jefferson D. R: "Virtual Time", ACM Trans. Prog. Lang. and Syst. 7, 3, July 1985, pages 404–425 (referred to here as "[JEF85]"; Fujimoto R. M., "Performance of Time Warp under synthetic workloads", In Proc. of the SCS Multiconf. on Dist. Simul. 22, 1, Jan. 1990, pp 23–28, referred to here as "[FUJ90b]"); in Berry O., "Performance Evaluation of the Time Warp distributed simulation mechanism", Ph.D. thesis, University of Southern California, May 1986 ("[BER86]"); Gafni A, "Rollback mechanism for optimistic distributed simulation systems", Proc. of the SCS Multiconference on Distributed Simulation 19, 3 (July 1988), pp. 61–67 ("[GAF88]"); Ronngren R. Ayani R, Fujimoto R M and Das S R, "Efficient Implementation of Event Sets in Time Warp", Proc. 7th Workshop on Par. & Dist. Sim. (PADS93), May 1993 ("[RON93]") and West, D. "Optimising Time Warp: Lazy rollback and lazy reevalutaion", M. S. thesis, University of Calgary, Jan 1988 ("[WES88]").

Thus the Time Warp mechanism for PDES uses global time stamping of messages to indicate their proper sequence: this Virtual Time paradigm ensures correct sequencing, and is not necessarily indicative of actual real-time intervals between events. In classic Time Warp, each processor which transmits a message keeps in its memory a corresponding "anti-message", which is a potential cancellation message for the original message. This is used in rollback, in which the processor transmits the anti-message which then "chases" the original message ultimately to cancel it when a local processor has received both the message and the anti-message.

As previously mentioned, time stamping is the implementation of a global virtual time (GVT); in the PDES, GVT is the smallest time stamp of all unprocessed messages. No event with a time stamp smaller than GVT will ever be rolled back i.e. cancelled, so the system can safely erase such old events, and can erase saved states with such time stamps. This erasing of old messages and states is important for freeing memory, and is known as "fossil collection". Further, irrevocable operations such as input and output from the simulation engine are prevented until their simulated time is less than GVT: the performance of such operations goes hand in hand with fossil collection.

Although rollback always occurs when a straggler is received, it is recognised that it may not always be necessary to undo events and cancel messages, because the computation may not have been altered sufficiently for this to be necessary. Some Time Warp systems ignore this possibility, and employ "aggressive cancellation", always sending anti-messages. There is however an algorithm known as "lazy cancellation" which recognizes that the sending of anti-messages may not always be necessary. In lazy cancellation, the operating system waits to see if the reexecution of the computation regenerates the same messages: if so, message cancellation is determined to be unnecessary. An anti-message is therefore only sent once the processor's local clock has swept past the simulated time at which the anti-message was created, without the regeneration of the same message.

For a given distributed processor architecture, the ratio of message communication time to local computation time has an inverse effect on the speedup. In an optimistic execution [FUJ90] two basic sources of message transmission can be distinguished. The first cause of message transmission, as in all parallel computation, is the physical separation of execution locations, and it can be controlled by clustering multiple logical processes onto each processor. These processes could communicate with each other in the same way that they communicate with remote processors, the difference being that communication time is shorter.

A second cause of message transmission is the particular requirements of optimistic synchronization, where cancellation messages must be transmitted to annihilate the erroneous outputs. The classic time warp implementation, which does not assume an ordered point to point message passing facility [JEF85], as previously mentioned, requires an anti-message for each individual rolled back output.

The purpose of the present invention is to improve the efficiency of time warp implementation by avoiding the need for so many cancellation messages, and thereby to improve speedup in PDES.

The invention provides data processing apparatus comprising distributed processors for the parallel discrete event simulation of physical processes by the parallel execution of virtual-time-stamped logical processes scheduled by the transmission of virtual-time-stamped messages on logical channels between the processors, each processor having a clock representing virtual time and ordering forward processing, and a memory for storing a state queue, representative of the physical state at different times of the system upon which the physical processes operate, and each processor being programmed with an operating system supporting optimistic time warp management of the message scheduling and message transmission and of the state queue, allowing interruption of forward processing for local rollback to an earlier virtual time and to earlier states and allowing cancellation of messages upon recognition by the processor of a sequence error in messages received at that or another processor; wherein the memory of each processor maintains a hierarchical list of time-stamped messages which have been received and buffered, and the processor is programmed, in response to a message on a given input channel indicative that rollback to a specified virtual time is required, to cancel as a group every message in its hierarchical list which is associated with that given input channel and whose virtual time is coincident with or after the specified virtual time; to rollback its clock to that earlier virtual time and to adjust the state queue accordingly; and to output a group cancellation message, indicative that rollback is required to a time corresponding to its new virtual time, to any destination to which the processor has already sent a message since that new virtual time, thereby propagating the rollback to other processors which may have been affected.

The invention also provides data processing apparatus comprising distributed processors for the parallel discrete event simulation of physical processes by the parallel execution of virtual-time-stamped logical processes scheduled by the transmission of virtual-time-stamped messages on logical channels between the processors, each processor having a clock representing virtual time and ordering forward processing, and a memory for storing a state queue, representative of the physical state at different times of the system upon which the physical processes operate, and each processor being programmed with an operating system supporting optimistic time warp management of the message scheduling and message transmission and of the state queue, allowing interruption of forward processing for local rollback to an earlier virtual time and to earlier states and allowing cancellation of messages upon recognition by the processor of a sequence error in messages received at that or another processor; wherein the memory of each processor maintains a hierarchical list of time-stamped messages which have been received and buffered, the hierarchical list comprising: for each input channel a buffer for storing input messages in time-stamp order of receipt, and a combined input queue in time-stamp order of the input messages of all the input channels which have been processed in the processor and not cancelled; the processor maintaining an input channel list storing in time-stamp order the names of the input channels and the time-stamp of the oldest buffered input message of each of the input channels; and the processor being programmed to roll back the combined input queue to a specified time-stamp in response to an indication that local rollback is required, to maintain the time-stamp order of the input channel list to adjust for any straggler input messages, and to feed the combined input queue with messages taken from the input channel buffers in the time-stamp order indicated by the input channel list.

The invention also provides a method of simulating physical processes performed on a physical system by the parallel execution of virtual-time-stamped logical processes scheduled by the transmission of virtual-time-stamped messages on logical channels between distributed processors, each processor being arranged for forward processing and having time warp management for interrupting forward processing to rollback to a previous virtual time, and in which, upon recognition of the need for rollback, the processor reverts to the appropriate earlier virtual time and correspondingly to the appropriate earlier states, allowing cancellation of messages transmitted or received since that earlier virtual time; wherein, at each processor, a hierarchical list is maintained of time-stamped messages which have been received; wherein, during secondary rollback initiated by a message on a given input channel, those messages in the hierarchical list which are associated with that given input channel and whose virtual time is coincident with or after the said earlier virtual time are cancelled as a group; and wherein a group cancellation message is output by the processor to other processors, indicative that rollback is required to a time corresponding to the said earlier virtual time, the group cancellation message being sent to all destinations to which the processor has already sent a message since that earlier virtual time, thereby propagating the rollback to other processes which may have been affected.

The invention also provides a method of simulating physical processes performed on a physical system by the parallel execution of virtual-time-stamped logical processes scheduled by the transmission of virtual-time-stamped messages on logical channels between distributed processors, each processor being arranged for forward processing and having time warp management for interrupting forward processing to rollback to a previous virtual time, and in which, upon recognition of the need for rollback, the processor reverts to the appropriate earlier virtual time and correspondingly to the appropriate earlier states, allowing cancellation of messages transmitted or received since that earlier virtual time; wherein, at each processor, a hierarchical list is maintained of time-stamped messages which have been received; the method comprising buffering the messages input on each individual input channel in time-stamp order, maintaining a list of the input channels in the order of the time-stamp of the earliest message buffered in each respective channel thereby adjusting for any straggler input messages, and feeding to a combined input queue messages in the time-stamp order from the input channels as indicated by the input channel list; and rolling back the combined input queue to a specified time-stamp in response to an indication that rollback is required.

By avoiding the need for so many cancellation messages; reducing rollback propagation times; reducing event cancellation overheads; and reducing event scheduling overheads; the invention can significantly improve the efficiency of time warp implementation and the degree of speedup in PDES.

Most modern parallel and distributed architectures provide ordered point to point communication, and the invention exploits the common availability of this facility. With the invention, a group of messages at a given destination can be annihilated by a source process via a single group cancellation message. This requires two basic assumptions: firstly, that at model implementation level each logical channel is the representation of a single sequential physical channel; and secondly that, at each logical process, messages from distinct input channels are maintained separately from each other.

For example, the first assumption requires that if there exist multiple parallel links from physical process PP1 to physical process PP2 then LP1, the logical representation of PP1 within the simulation, should also have an equivalent number of logical output channels to LP2, the logical representation of PP2. This, in conjunction with the second assumption ensures that the arrival order of messages at the receiving end of each channel corresponds to the non-decreasing order of their time stamps.

The group cancellation method saves on the required number of cancellation messages and also provides the basis for a novel Tentative Group Cancelation (TGC) algorithm which integrates a number of other performance optimizing features.

Thus, it is a preferred feature of the invention that the group cancellation on rollback is tentative, each processor being programmed to store those messages which have been cancelled as a group, to determine whether the re-execution of the processes as a result of the rollback leads to the generation of messages different from those tentatively cancelled, and, if not, to send a restore-previous-group message to the said destinations to cause restoration of the cancelled messages in the input of the destination processor or processors.

The experience of optimistic simulation has highlighted a number of algorithmic factors which have a significant impact on the performance of the mechanism. These algorithmic factors can be grouped into three distinct but interrelated classes: a) event set handling structures; b) rollback propagation procedures; and c) error detection/correction strategies. In the following subsections these factors are discussed in more detail.

Effects of event set handling structures

The comparative study of conservative and optimistic simulations using synthetic workloads in [FUJ90b] pointed to an interesting contrast between the performance characteristics of the optimistic and conservative methods. The study found that in a simulation of a given system the work-load density, represented by message population, i.e. the number of messages flowing in the system at each point of time, affects the performance of the simulator such that the performance of an optimistic simulator degrades but in contrast the performance of a conservative simulator significantly improves.

The behaviour of an optimistic method is explained as follows: the classic optimistic system is based on a linear event list structure. The cost of scheduling and cancelling events into linear event lists is proportional to the size of the event list. Thus, as in sequential simulation, the overall event handling costs increase proportionally to the event set size. However, in the context of optimistic simulation, this has yet another, more significant side effect: the dependency of the event handling costs on the size of each local event set implies that the slowest process (in simulated time), tending to accumulate a larger backlog of pending events, is made progressively slower. Thus the work load imbalance is further aggravated, which in turn leads to a greater number of rollbacks within the system. This effect was empirically demonstrated by Ronngren et. al. [RON93], where it was shown that the impact of event set implementation on the performance of the optimistic simulation can far exceed the improvement accounted for by a simple reduction in list management time. Particularly for asymmetric workloads, by more efficient input queue implementation the number and extent of rollbacks were reduced such that, as a result, a speedup improvement of an order of magnitude was demonstrated. The "skew heap" event handling structure of [RON93], provided a faster mechanism for the ordering of future events. A skew heap is an ordered binary tree which exhibits an 0(log(N)) performance characteristic. In this implementation, a message is transferred from the future part to the linear list part whenever an event is processed. Handling of past events and message annihilation are still carried out through the linear list.

The Effect of Rollback Propagation Procedures

Another significant factor in achieving higher performance from optimistic simulation is to ensure speedy propagation of rollbacks once an error is detected. A number of experimental studies have indicated the crucial impact of prompt rollback propagation on the system performance. Delayed rollback propagation means that the errors will infiltrate deeper into the system and thus the required number and extent of rollback operations will increase. In extreme cases, this may lead to thrashing behaviour where a larger part of the execution time is spent in rolling back erroneous operations than is spent on forward computations. Error detection/correction strategies Event execution in a strictly non-decreasing order of time stamps is a sufficient but not always necessary requirement for causality maintenance. Therefore, even when an ordering error is detected, it may still be possible to avoid cancellations. As previously mentioned, to that end lazy cancellation [BER86], [GAF88] and lazy reevaluation [WES88] schemes have been proposed. However, in both cases it has been observed that the advantage of avoiding unnecessary cancellations is offset by the negative effect of the delay in rollback propagation which is required by these two strategies. In both cases, the transmission of cancellation messages (ie. rollback propagation) is delayed by the need to check whether cancellation is necessary, during which time the errors spread deeper into the system.

A preferred embodiment of the invention will now be described, by way of example only, with reference to the accompanying drawings, in which.

Figure 5:
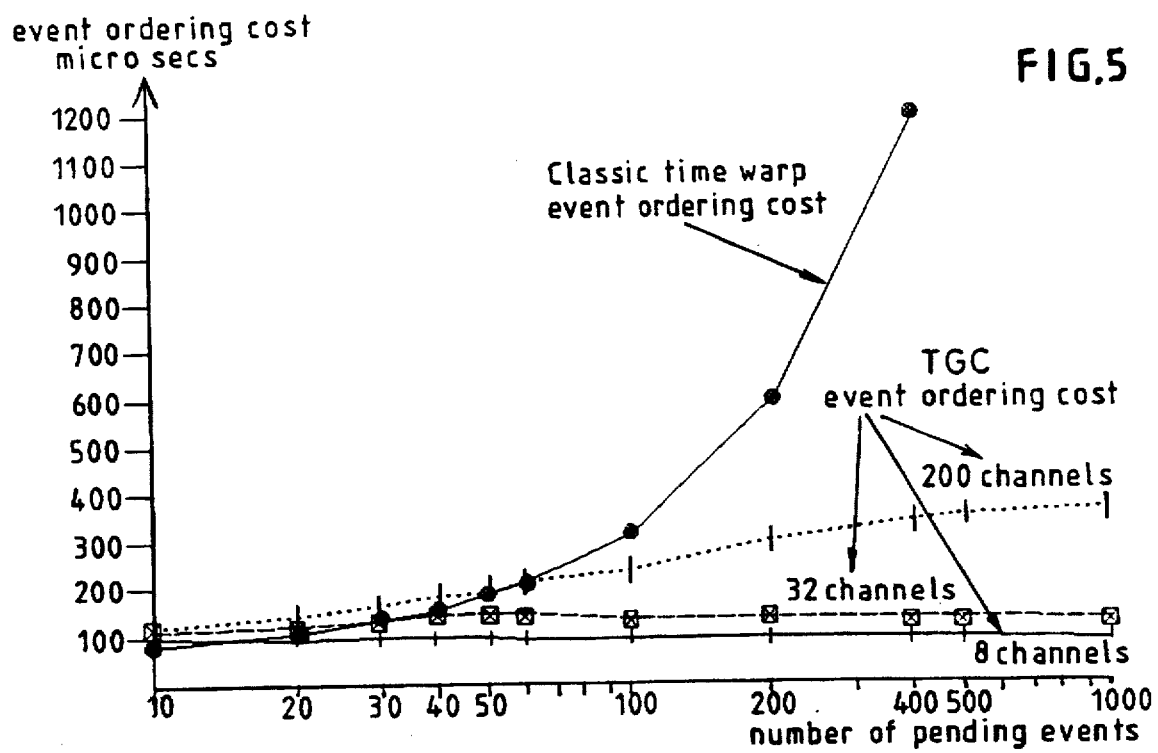
Figure 6:
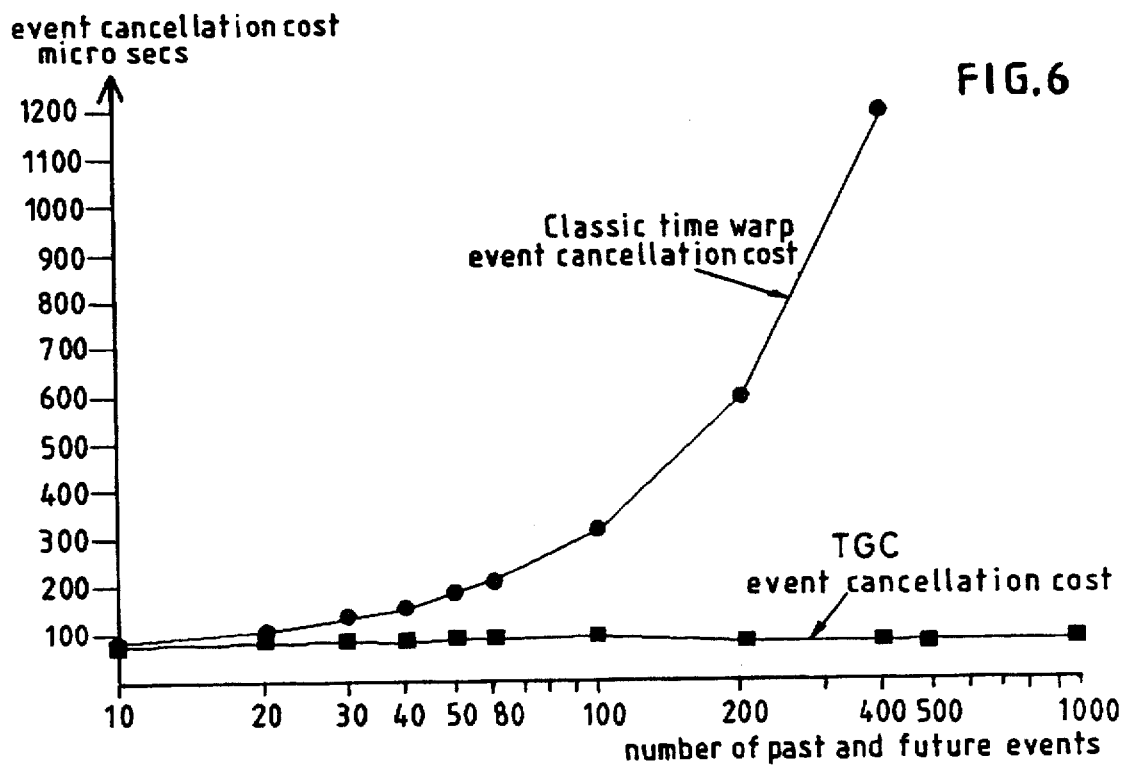

FIG. 5 is a graph showing the event ordering costs, in microseconds, in classic Time Warp compared with those in TGC in embodiments of the invention, representing event ordering cost as a function of the number of pending events respectively for TGC with 8, 32 and 200 channel processors; and FIG. 6 is a graph showing the event cancellation costs, in microseconds, in classic Time Warp compared with those in TGC, as a function of the number of past and future events.

Figure 1:
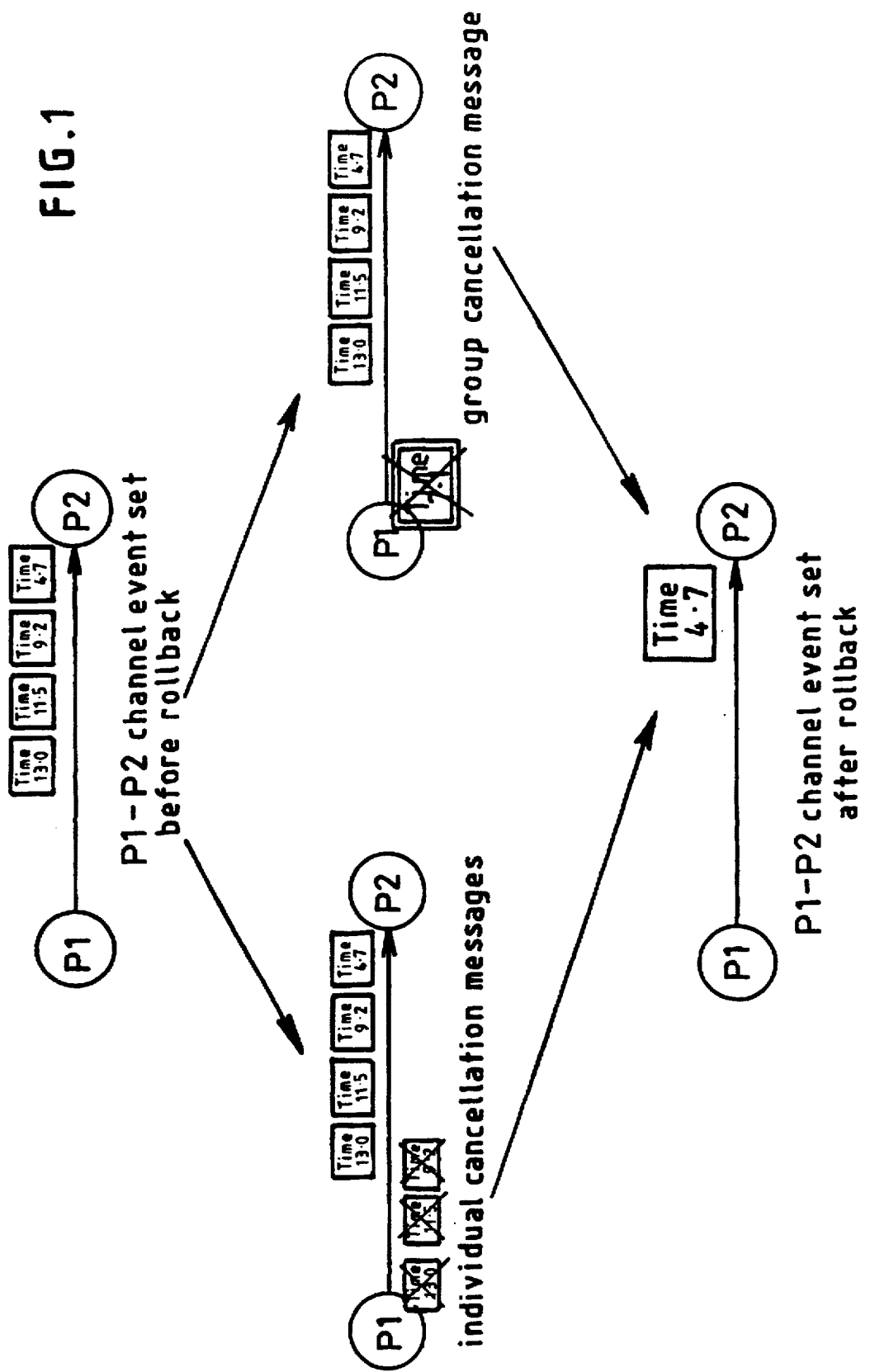
FIG. 1 is a diagram illustrating the group cancellation of messages in accordance with the invention, on a one-way channel from process P1 to process P2, messages being represented as boxes with time-stamps.

Group cancellation is illustrated in FIG. 1, for processes P1 and P2. Cancellation is indicated by the crossing-out of boxes representing time-stamped messages—the time-stamps are the numerals within the boxes, in virtual time order.

In the light of the above mentioned factors affecting the performance of optimistic simulators, a so-called Tentative Group Cancellation (TGC) algorithm is proposed. TGC relates to the local control mechanism of the optimistic simulation. The global control mechanism is assumed to remain the same as that of the classic Time Warp machine. The TGC mechanism assumes a message-passing process-orientated environment, where communication among processes takes place by the exchange of messages over inter-process communication channels. Also, at the model implementation level, it is assumed that multiple links between two physical processes of a simulated system are represented by an equivalent number of logical channels. These assumptions are akin to those of the conservative dead-lock avoidance algorithm disclosed in Chandy K M, and Misra J, "Distributed Simulation: A case study in design and verification of distributed programs", IEEE Trans. on Softw. Eng., SE-5 5, Sep. 1979, pp 440–452 [CHA79]. On these assumptions, simulation messages sent over a logical channel within each forward execution period—note that consecutive forward execution periods are separated by rollback operations—will have non-decreasing time stamps. At the destination end of a channel, messages arriving over the channel are first buffered separately, in first-in-first-out (FIFO) order. On the assumptions made above, the FIFO buffering of messages received over a given channel corresponds to their buffering in increasing time stamp order.

Figure 2:
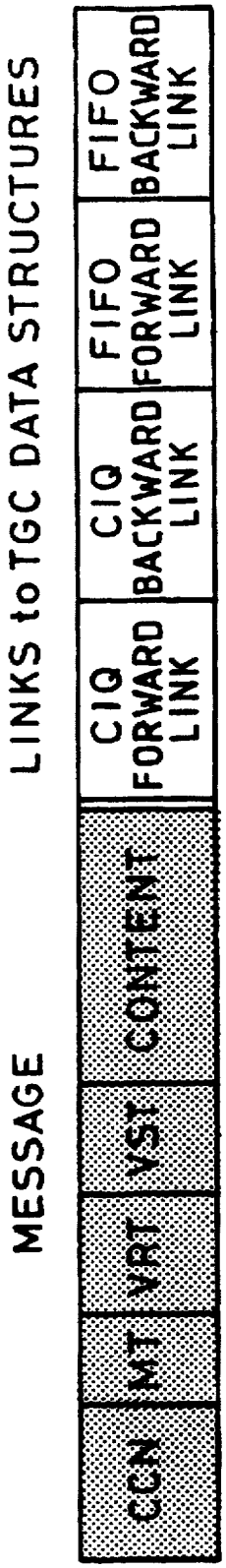
FIG. 2 is a diagram of a message format for use in TGC in PDES embodying the invention.

As shown in FIG. 2, messages are stamped with four values: communication channel name (CCN), message type (MT), Virtual Receive Time (VRT) which is equivalent to the message time-stamp, and virtual send time (VST). Thus the message format can be represented as: <CCN, MT, VRT, VST, CONTENT>. CCN is a unique value which is used to identify the channel of communication and to deliver messages from source to destination in the sent order. In this figure, the shaded part represents the actual message as received, and the unshaded part represents the pointers which are used to insert the message in various TGC structures. An example of this method of message delivery is interval routing in the virtual channel mechanism of T9000 networks as disclosed in INMOS Limited, "The T9000 Transputer", INMOS databook series, 1991, pp 35–43 [INM91].

At the destination, messages arriving over a given channel are first buffered in the bidirectional FIFO buffer belonging to that channel. In addition to a FIFO buffer, each channel has a clock associated with it which indicates the time stamp of the message at the front of the channel buffer. The FIFO buffer of each channel represents the set of events which have been received over that channel. The complete event set at each node consists of the set of the channel-event-sets. The algorithm maintains a clock-ordered list of input channels (ICL) which is an efficient embodiment of the combined set of all recent events received by the process. Each time a channel clock is updated, the position of the channel in the ICL is readjusted such that the channel with the smallest channel clock value is always at the head of the ICL. Thus, at each Next-Event-Selection point, the process can find the smallest time stamped unprocessed event at the front of the FIFO buffer of the channel which is at the head of the ICL. Selected events are not removed from the FIFO buffers. Only the FIFO front pointer is advanced forward. Thus FIFO buffers provide a short cut route for rollbacks and, on arrival of a group cancellation message over a given channel, the specified cancellations can be realized without the need to search through the whole combined input set. The next selected event is inserted in a secondary data structure which maintains the Combined Input Queue (CIQ) of the local process. To allow random deletion of cancelled events, the CIQ is implemented as doubly-linked linear list. The role of the CIQ is to facilitate rollbacks and reexecutions after each rollback. A group cancellation message received over channel CHAN with a virtual send time of $VST_{gc}$ results in four basic operations: 1) by searching the CHAN buffer, the virtual receive time of the group cancellation, $VRT_{gc}$, is established; 2) all output channels with output channel clocks greater than $VRT_{gc}$ transmit a group cancellation message with $VST=VRT_{gc}$; 3) all the messages with CCN= CHAN and $VRT>VRT_{gc}$ are removed from the event set; 4) the state with process-clock<=$VRT_{gc}$ is reinstated.

After a group cancellation, the CIQ may contain event messages which have time stamps greater than the process clock. This is primarily due to the fact that messages inserted in the CIQ with CCN<>CHAN (not equal to CHAN) are not annihilated. Thus these messages must be reprocessed. On the other hand, while reprocessing of the CIQ is in progress, the process may receive new messages, which may have time stamps smaller than those in the CIQ. Thus to ensure that the next selected event is the event with the smallest time stamp in the whole event set structure, at each Next-Event-Selection point, a comparison is made between the possible next events from CIQ and ICL and the structure with the smallest next-event-time is selected for input.

Figure 3:
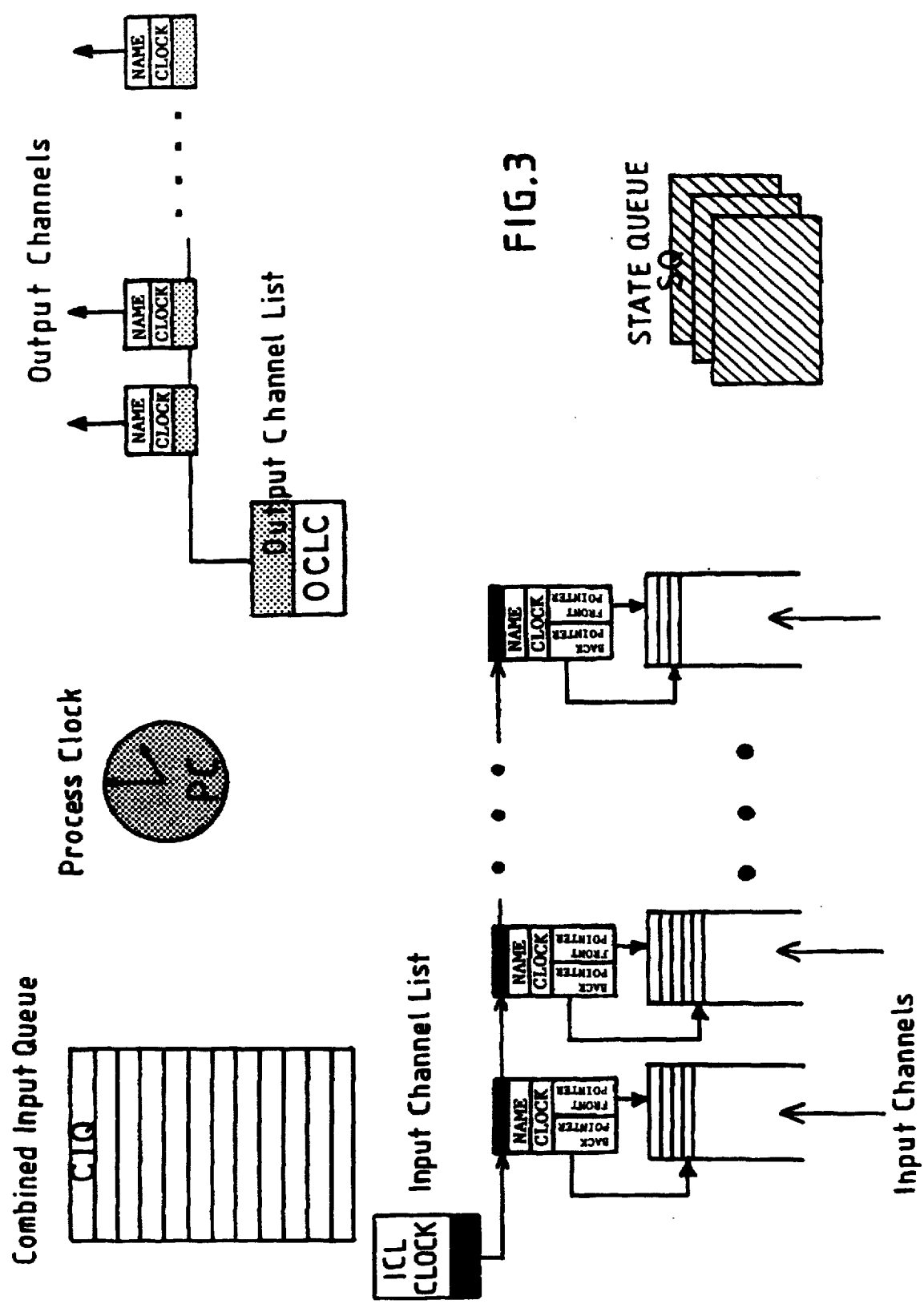
FIG. 3 is a diagram of the basic component data structures of a processor programmed for TGC.
Figure 4:
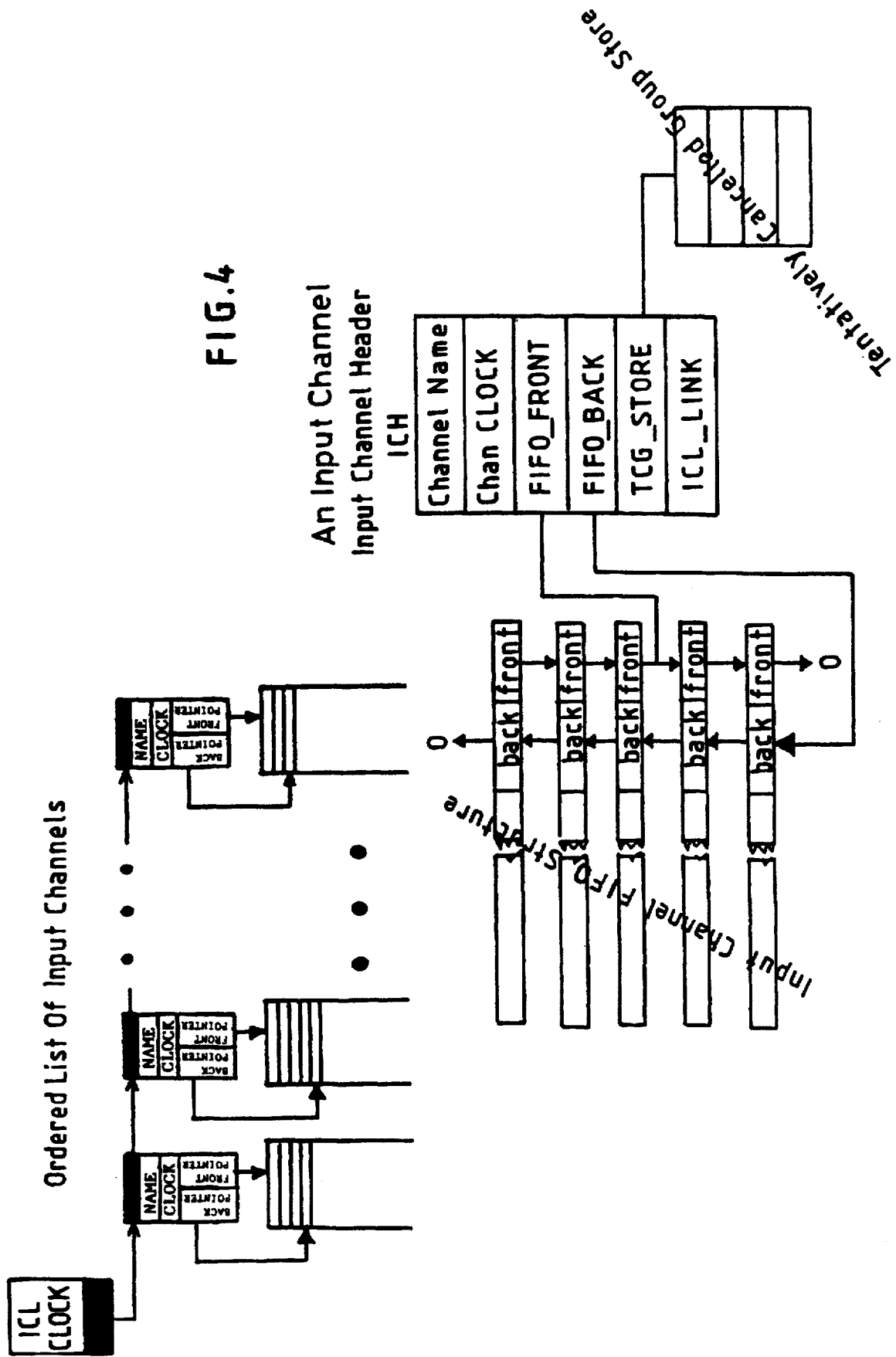
FIG. 4 is a more detailed diagram of the structure of one of the input channels of FIG. 3.

Thus, a process within the proposed TGC system requires the following components, illustrated in FIG. 3:

1—A process clock (PC).

2—An ordered list of input channels (ICL) with each channel containing its own FIFO buffer and associated variables.

3—A combined input queue (CIQ).

4—An ordered list of output channels (OCL).

5—A state queue (SQ).

FIG. 3 illustrates the outline of the TGC process with its basic data structures. A more detailed description of the data structures representing the above components and how they are managed by the process is given below.

Process-Clock (PC) holds the VRT value of the currently processed message. When the next message is selected for processing, the Process-Clock gets updated to the VRT of that message. If both CIQ and ICL are empty the process clock is set to infinity.

Input-Channel-List (ICL) is the ordered linear linked list of Input-channel-Headers.

Input-Channel-Header (ICH) is a record consisting of the name of the input channel, back and front pointers to the FIFO buffer associated with the channel, the Tentatively Cancelled Group Store pointer (TCG store) and the Input-Channel-Clock.

TCG store is a pointer which holds the address of the most recently cancelled group of messages from that buffer.

Input-Channel-Clock (ICC) holds the VRT value of the message at the front of the channel FIFO buffer. When a FIFO buffer becomes empty, then its ICC is set to infinity.

The ICL, the Input-Channel-List, is ordered in the increasing order of ICC's and owns its own clock ICLC, the Input-Channel-List-Clock, which reflects the value of the smallest ICC in the ICL.

Combined-Input-Queue (CIQ) is a bidirectional linked list of recently input messages processed (and not cancelled). The CIQ, the Combined-Input-Queue, provides an efficient facility to rollback to the required virtual time in the past. Once side effect annihilation has been accomplished (i.e. local rollback and TGC transmission has been completed) then forward processing will resume from the point in time to which the process has rolled back, i.e. by re-processing the new input and the ensuing inputs now in the CIQ. While messages from CIQ are reprocessed, at each message selection point, the VRT of the next message from the CIQ is checked against the ICLC value. If the ICLC is smaller, the message from the ICL is selected for processing (and is inserted in the CIQ at the back of the next message from the CIQ).

Output-Channel-List (OCL) is the ordered linked list of Output-Channel-Headers.

Output-Channel-Header (OCH) is the record consisting of the name of the output channel, the Output-Channel-Clock, and the pointer to the next OCH in the OCL.

Output-Channel-Clock (OCC) holds the VST value of the last message transmitted over that channel.

State-Queue (SQ) holds the list of all states saved in recent simulation time in the increasing order of their Process-Clock. Recent simulation time refers to the period (in simulation time) from the last fossil collection time to the present.

The input handler of the TGC controller is an interrupt driven (preemptive) high priority process. Operations of the input handler are therefore uninterruptable (atomic). Three distinct types of messsage are communicated within the system:

a) simulation event (SE) messages, b) Tentative Group Cancellation (TGC) messages, and c) Restore Previous Group (RPG) messages. Whenever a message arrives at a processing element, its type is checked. Depending on the type of the message, one of three scenarios may occur. In the following pseudo code these scenarios are described in a topdown fashion:

```
handle-input ( message)
(
    switch (message.TYPE) of
    SE:
        if( message.VRT < PC ) then
            OUT_TGC(message.VRT);
            ICL_INSERT(message);
    TGC:
        ICL_FIND_VRT( message );
        if ( message.VRT < PC ) then
            OUT_TGC (message.VRT);
            IN_TGC ( message);
    RPG:
        Restore_Group( message.CCN );
)
```

ICL_INSERT(), OUT_TGC(), ICL_FIND_VRT(), IN TGC() and Restore_Group() are subroutines which are described (in pseudocode) below.

```
ICL_INSERT( message )
(
    CHAN : = message.CCN;
    If message.VRT < CHAN.clock then
        update CHAN.clock;
        readjust CHAN position in ICL; /* ICL is
        Input Channel List*/
        update ICLC; /* ICLC is ICL clock*/
    insert message in CHAN.FIFO;
)
ICL_FIND_VRT( message )
(
    CHAN : = message.CCN; ARGUMENT : = message.VST;
    message.VRT takes the value of VRT of the
    entry in CHAN.FIFO with
    smallest VST greater than ARGUMENT;
)
OUT_TGC( time )
(
    for all members of OCL with OCC > time DO
    send TGC message with VST = time;
)
IN_TGC( message)
(
    CHAN : = message.CCN;
    with CHAN do:
        discard previous contents of TCG_store;
        remove entries with VRT greater than
        message. VRT;
        store removed entry group in TCG_store;
        if message.VRT < PC then
        restore state with state.PC <= message.VRT;
        discard message;
)
Forward Execution:
(
    SAVE state;       /* in SH State-Queue */
    SELECT next input list; /* ICL or CIQ */
    if ICL selected then
    (
        ICL-COPY(message);
        CIQ-INSERT(message);
    )
    else CIQ-COPY(message); /* message is
    already in CIQ */
    PC: = message.VRT;
    TO-APPLICATION(message);
)
```

The output handling procedure

In classic optimistic algorithms, the output handler maintains a copy of every recently sent message in a VST ordered list. These messages are marked as negative- or anti-messages of the original output and at rollback points they are released to chase and annihilate their positive counterparts. In the TGC algorithm a different method is used. TGC does not keep a copy of the output messages. Instead, for each output channel, an Output-Channel-Clock (OCC) is maintained. The OCC of each output channel represents the VST of the last message which was sent over that channel. When a rollback occurs, each output channel with an OCC greater than the new virtual local time transmits a single TGC message to its destination. The VRT of the TGC message is determined at the destination end of the channel. The source process only provides the virtual send time VST for its TGC transmissions which indicates the new local time of the source process.

At the destination end, not the VST but the VRT of the TGC message is required. This is determined by searching through the FIFO buffers at destination end of the channel. Traversing from the back of the FIFO, i. e. from entries with greatest VST in the direction of smaller VST the entry is searched for with an equal or a smaller VST than that of the TGC message. Entries with equal or smaller VST are safe and should not be cancelled. Thus the search ends when first safe entry is encountered. The VRT of the entry immediately "behind" the first safe entry is assigned to the VRT of the TGC message. TGC messages propagated over appropriate output channels carry this value as their VST stamp and the group of entries thus found is removed from the event set structure of the process.

The advantage of this procedure, apart from optimization on message transmission costs, is that the need for maintaining a large output queue is eliminated and hence a more efficient utilization of memory space is made possible.

The rollback procedure

The first step in the rollback operation is to propagate appropriate Tentative Group Cancellation messages to those output channels which may have been affected, with minimum delay. If the rollback is a consequence of a straggler message (i.e. primary rollback), then all output channels with output clocks greater than the VRT of the straggler receive a TGC message whose VST is equal to the straggler VRT value. However, if the rollback is due to the arrival of a TGC message over an input channel (i.e. secondary rollback), then the VRT of the TGC message must first be established, so that TGC messages can be propagated over those output channels which have greater output clocks. Then all the inputs with a smaller VRT in the channel FIFO are removed from the event set structure. The removed message group replaces the previous stored group in the channel structure. After a rollback the culprit input channel becomes empty and the channel clock becomes +infinity. Hence the position of the channel within the ICL must be readjusted.

The second step in the rollback is to check whether the cancellations were necessary. If it is found that cancellations could have been avoided then RPG messages are sent to restore the previously cancelled messages; else forward processing continues by searching the state queue and finding the state with a process clock value smaller than or equal to the time of the rollback. That state is restored and forward execution proceeds from there onwards.

Tentative Cancellation vs lazy or aggressive cancellation

Messages cancelled by TGC are kept in a special store owned by the channel, and they can be reclaimed by a RESTORE-PREVIOUS-GROUP (RPG) message. An RPG will simply present the messages in the channel-store to the input handler as other simulation messages. The tentative cancellation scheme combines the advantages of aggressive and lazy cancellation in that it does not postpone propagation of rollbacks and hence does not allow them to spread during output or state evaluation. However, it allows the process to jump forward and avoid unnecessary re-computations, if and when, they can be avoided.

Cost comparison with classic Time Warp:

A close comparison of the proposed optimistic algorithm with the classic Time Warp reveals the advantages of the TGC method. As previously stated, TGC tends to produce fewer communication overheads than the classic approach. The following considerations, supported by experimental results, indicate that TGC is also more efficient in rollback propagation, event holding and event annihilation.

Rollback propagation delay

When arrival of a straggler causes a rollback (primary rollback), the classic Time Warp mechanism needs to search the input queue to ascertain whether the anti-message of the straggler has already been received or not. This is necessary because if an anti-message is available then no rollback is issued. The search for an anti-straggler involves combined input from all sources through the linear list and the time cost is proportional to the number of recently processed events which are revisited. In secondary rollbacks, due to the arrival of anti-messages, again the input queue must be searched, in this case to ascertain whether the positive version of the anti-message has been received. If the positive version has not yet been received, rollback does not occur. Thus, the classic method requires a search with $O(n)$ cost characteristics before it can propagate the primary or secondary rollbacks (where n is the mean number of recently processed events which must be revisited at each rollback). In contrast, a primary rollback at a TGC process does not require any search of the past events before rollback is propagated. Thus a primary rollback is propagated almost immediately and secondary rollbacks require only the search of the culprit input channel buffer rather than the combined input of all channels. Thus the pre-propagation search time is reduced.

Mean event holding cost

Event holding time refers to the mean time which is spent in carrying out an insert plus a remove operation on the event holding structure. In the evaluation of event set structures this is the de facto standard benchmark operation. The event holding cost of the Time Warp linear list is $O(N_e)$, where $N_e$ refers to the number of events held by the structure. The event holding time of the TGC is $O(N_c)$ where $N_c$ is the number of non-empty channels in the ICL list. Since each non-empty channel will at least hold one event within it, $N_c <= N_e$ always holds true and the costs of TGC event holding procedure will always be smaller than that of the linear list of events. For most practical simulations, such as simulation of queueing networks with medium to high workloads, each input channel is likely to be responsible for the queueing of many event messages at each point in time. In such circumstances $N_c << N_e$ and the cost of event holding through the ICL of TGC can become proportionally smaller than that of the linear event list.

Event annihilation cost

Event annihilation in both methods requires the searching of the event set structure. However the search in classic Time Warp, again, involves the combined set of events from all input sources while the TGC method limits the search to the event set received from a single source and hence saves on the searching costs. Additionally, annihilation of a group of N messages in TGC requires one search operation only. The classic method, in contrast, dictates N search operations.

The PDES apparatus has a global operating system which includes input/output, to input the states of the physical system, and to output various items of information. Outputs would include the performance of the system, including the speed of computation; the number of messages sent between which nodes; and the extent of use of each node; useful in analysing the physical system. Outputs could also include the state-variables, either just at the end of processing or at intermediate stages as well.

The PDES with TGC can be implemented on any distributed memory architecture such as the hypercubes, the nCUBE Caltech Mark III, and i PSC/2, and the Wavetracer which is a 3-D mesh. PDES of a telephony network has been demonstrated using specific network models such as ITN, TNM and SS7 (Signalling System 7), with proprietary Time Warp software of Jade Simulations International Corporation.

This Jade Time Warp Software rests on Unix and C++ at the lowest level; beneath a Virtual OS Kernel. It comprises, at the next level, a Sequential Executive as well as the Time Warp System. Over that, software comprising Run Time and Performance Analysis Tools; Parallel I/O; C, C++ and Sim++ Library programs are provided. At the highest level, operation is controlled by specific Simulation Programs.

Although a PDES system has been described with tentative cancellation, group cancellation in accordance with the invention can be performed without the TGC algorithm. Further, the invention can be implemented in other ways which will occur to the reader, whilst within the scope of the claims.

I claim:

1. Data processing apparatus comprising distributed processors for the parallel discrete event simulation of physical processes by the parallel execution of virtual-time-stamped logical processes scheduled by the transmission of virtual-time-stamped messages on logical channels between the processors, each processor having a clock representing virtual time and ordering forward processing, and a memory for storing a state queue, representative of the physical state at different times of the system upon which the physical processes operate, and each processor being programmed with an operating system supporting optimistic time warp management of the message scheduling and message transmission and of the state queue, allowing interruption of forward processing for local rollback to an earlier virtual time and to earlier states and allowing cancellation of messages upon recognition by the processor of a sequence error in messages received at that or another processor; wherein the memory of each processor maintains a hierarchical list of time-stamped messages which have been received and buffered, and the processor is programmed, in response to a message on a given input channel indicative that rollback to a specified virtual time is required, to cancel as a group every message in its hierarchical list which is associated with that given input channel and whose virtual time is coincident with or after the specified virtual time; to rollback its clock to that earlier virtual time and to adjust the state queue accordingly; and to output a group cancellation message, indicative that rollback is required to a time corresponding to its new virtual time, to any destination to which the processor has already sent a message since that new virtual time, thereby propagating the rollback to other processors which may have been affected.

2. Apparatus according to claim 1, in which the group cancellation on rollback is tentative, each processor being programmed to store those messages which have been cancelled as a group, to determine whether the re-execution of the processes as a result of the rollback leads to the generation of messages different from those tentatively cancelled, and, if not, to send a restore-previous-group message to the said destinations to cause restoration of the cancelled messages in the input of the destination processor or processors.

3. Apparatus according to claim 1, in which each processor is programmed to maintain, for each input channel, a FIFO buffer for storing the messages in time-stamp sequence.

4. Apparatus according to claim 3, in which each processor is programmed to maintain a list of all its input channels in order of the time-stamp of the earliest time-stamped message of each channel, so that the next unprocessed message intended for processing is at the front of the buffer of the channel which is at the front of the input channel list.

5. Apparatus according to claim 3, in which each processor is programmed to keep in the FIFO buffer even those messages which have been selected for processing, and to advance the FIFO front pointer to indicate the position of the messages which have been processed yet not fossil-collected.

6. Apparatus according to claim 1, in which each processor is programmed to maintain a combined input queue of messages from all the input channels already selected for processing, and which have not yet been fossil-collected.

7. Apparatus according to claim 6, in which the combined input queue is a bidirectional, doubly-linked linear list.

8. Data processing apparatus comprising distributed processors for the parallel discrete event simulation of physical processes by the parallel execution of virtual-time-stamped logical processes scheduled by the transmission of virtual-time-stamped messages on logical channels between the processors, each processor having a clock representing virtual time and ordering forward processing, and a memory for storing a state queue, representative of the physical state at different times of the system upon which the physical processes operate, and each processor being programmed with an operating system supporting optimistic time warp management of the message scheduling and message transmission and of the state queue, allowing interruption of forward processing for local rollback to an earlier virtual time and to earlier states and allowing cancellation of messages upon recognition by the processor of a sequence error in messages received at that or another processor; wherein the memory of each processor maintains a hierarchical list of time-stamped messages which have been received and buffered, the hierarchical list comprising: for each input channel a buffer for storing input messages in time-stamp order of receipt, and a combined input queue in time-stamp order of the input messages of all the input channels which have been processed in the processor and not cancelled; the processor maintaining an input channel list storing in time-stamp order the names of the input channels and the time-stamp of the oldest buffered input message of each of the input channels; and the processor being programmed to roll back the combined input queue to a specified time-stamp in response to an indication that local rollback is required, to maintain the time-stamp order of the input channel list to adjust for any straggler input messages, and to feed the combined input queue with messages taken from the input channel buffers in the time-stamp order indicated by the input channel list.

9. Apparatus according to claim 1, in which each processor is programmed to maintain a list of its output channels in order of the time stamp of the most recently-transmitted message of each channel, so that the channel with the most recently-transmitted message is at the front of the the output channel list.

10. Apparatus according to claim 1, in which each processor is programmed to maintain a record of the virtual time of the last message transmitted from each of its output channels.

11. Apparatus according to claim 8, in which each processor is programmed to maintain a list of its output channels in order of the time stamp of the most recently-transmitted message of each channel, so that the channel with the most recently-transmitted message is at the front of the the output channel list.

12. Apparatus according to claim 8, in which each processor is programmed to maintain a record of the virtual time of the last message transmitted from each of its output channels.

13. A method of simulating physical processes performed on a physical system by the parallel execution of virtual-time-stamped logical processes scheduled by the transmission of virtual-time-stamped messages on logical channels between distributed processors, each processor being arranged for forward processing and having time warp management for interrupting forward processing to rollback to a previous virtual time, and in which, upon recognition of the need for rollback, the processor reverts to the appropriate earlier virtual time and correspondingly to the appropriate earlier states, allowing cancellation of messages transmitted or received since that earlier virtual time; wherein, at each processor, a hierarchical list is maintained of time-stamped messages which have been received; wherein, during secondary rollback initiated by a message on a given input channel, those messages in the hierarchical list which are associated with that given input channel and whose virtual time is coincident with or after the said earlier virtual time are cancelled as a group; and wherein a group cancellation message is output by the processor to other processors, indicative that rollback is required to a time corresponding to the said earlier virtual time, the group cancellation message being sent to all destinations to which the processor has already sent a message since that earlier virtual time, thereby propagating the rollback to other processes which may have been affected.

14. A method according to claim 13, in which the group cancellation on rollback is tentative, and the processor stores those messages which have been cancelled as a group, to determine whether re-execution of the processes as a result of the rollback leads to the generation of messages different from those tentatively cancelled and, if not, to send a restore-previous-group message to the said destinations to cause restoration of the cancelled messages in the processor or processors at the destination or destinations.

* * * * *